United States Patent [19]

Yamamoto

[11] Patent Number: 5,347,569

[45] Date of Patent: Sep. 13, 1994

[54] GAIN CONTROL CIRCUITRY FOR QAM DEMODULATOR

[75] Inventor: Takeshi Yamamoto, Tokyo, Japan

[73] Assignee: NEC Corporation, Japan

[21] Appl. No.: 841,820

[22] Filed: Feb. 26, 1992

[30] Foreign Application Priority Data

Feb. 27, 1991 [JP] Japan .................................. 3-031263

[51] Int. Cl.$^5$ ........................ H04L 5/12; H04L 23/02
[52] U.S. Cl. ................................... 375/39; 375/98; 375/102; 329/304
[58] Field of Search ................ 375/94, 98, 102, 39; 371/43; 329/304

[56] References Cited

U.S. PATENT DOCUMENTS 4,864,244  9/1989  Sasaki .................................. 375/98
4,912,728  3/1990  Deguchi ............................ 329/304

*Primary Examiner*—Stephen Chin
*Assistant Examiner*—Don N. Vo
*Attorney, Agent, or Firm*—Laff, Whitesel, Conte & Saret

[57] ABSTRACT

In a QAM demodulator, gain-controlled amplifiers are provided respectively for the in-phase and quadrature channel baseband components of the signal, and a set of data and error signals is recovered from the output of each gain-controlled amplifier. To determine the location of the signal point of each channel component, the QAM signal constellation is divided along the axis of the channel into two outermost regions A, an innermost region B and two intermediate regions C, and further divided along the axis of the channel into two outer regions E and an inner region D therebetween. In response to each set of data and error signals, the location of the signal point of each baseband component is determined with respect to the regions A, B and C to produce a first logical output signal and with respect to the regions D and E to produce a second logical output signal. Each of the gain-controlled amplifiers is controlled in response to the first logical output signal derived from the own channel and the second logical output signal derived from the other channel.

4 Claims, 5 Drawing Sheets

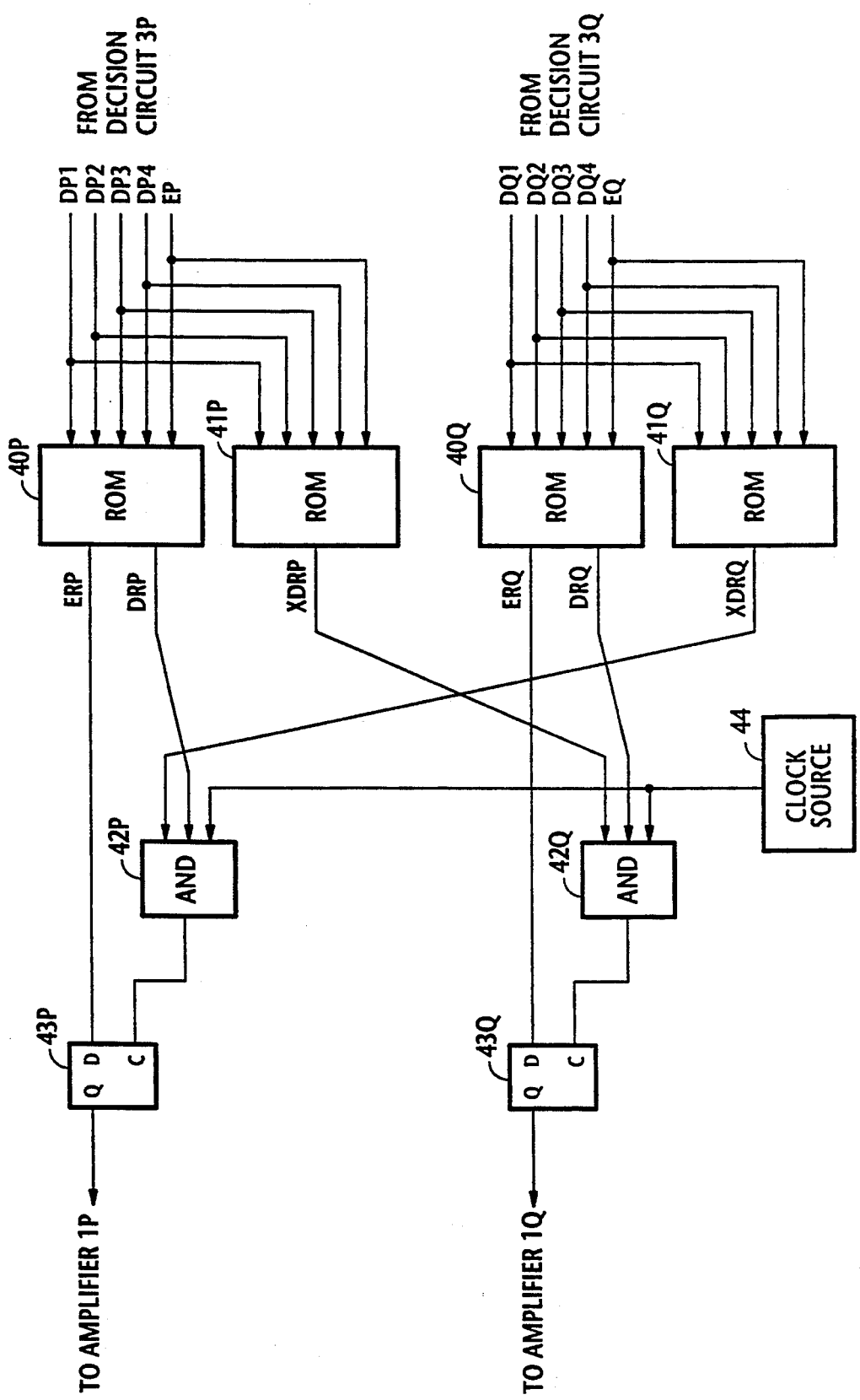

FIG. 5

| | DP1 (DQ1) | DP2 (DQ2) | DP3 (DQ3) | DP4 (DQ4) | EP (EQ) | DRP (DRQ) | ERP (ERQ) |
|---|---|---|---|---|---|---|---|
| 31 | 1 | 1 | 1 | 1 | 1 | 1 ↑ | 1 |
| 30 | 1 | 1 | 1 | 1 | 0 | 1 | 1 |
| 29 | 1 | 1 | 1 | 0 | 1 | 1  A | 1 |
| 28 | 1 | 1 | 1 | 0 | 0 | 1 | 1 |
| 27 | 1 | 1 | 0 | 1 | 1 | 1 ↓ | 1 |
| 26 | 1 | 1 | 0 | 1 | 0 | 0 ↑ | 0 |
| 25 | 1 | 1 | 0 | 0 | 1 | 0 | 0 |
| 24 | 1 | 1 | 0 | 0 | 0 | 0 | 0 |
| 23 | 1 | 0 | 1 | 1 | 1 | 0 | 0 |
| 22 | 1 | 0 | 1 | 1 | 0 | 0 | 0 |
| 21 | 1 | 0 | 1 | 0 | 1 | 0  C | 0 |
| 20 | 1 | 0 | 1 | 0 | 0 | 0 | 0 |
| 19 | 1 | 0 | 0 | 1 | 1 | 0 | 0 |
| 18 | 1 | 0 | 0 | 1 | 0 | 0 | 0 |
| 17 | 1 | 0 | 0 | 0 | 1 | 0 ↓ | 0 |
| 16 | 1 | 0 | 0 | 0 | 0 | 1 ↑ B | 1 |
| 15 | 0 | 1 | 1 | 1 | 1 | 1 ↓ | 0 |
| 14 | 0 | 1 | 1 | 1 | 0 | 0 ↑ | 0 |
| 13 | 0 | 1 | 1 | 0 | 1 | 0 | 0 |
| 12 | 0 | 1 | 1 | 0 | 0 | 0 | 0 |
| 11 | 0 | 1 | 0 | 1 | 1 | 0 | 0 |
| 10 | 0 | 1 | 0 | 1 | 0 | 0 | 0 |
| 9 | 0 | 1 | 0 | 0 | 1 | 0  C | 0 |
| 8 | 0 | 1 | 0 | 0 | 0 | 0 | 0 |
| 7 | 0 | 0 | 1 | 1 | 1 | 0 | 0 |
| 6 | 0 | 0 | 1 | 1 | 0 | 0 | 0 |
| 5 | 0 | 0 | 1 | 0 | 1 | 0 ↓ | 0 |
| 4 | 0 | 0 | 1 | 0 | 0 | 1 ↑ | 1 |
| 3 | 0 | 0 | 0 | 1 | 1 | 1 | 1 |
| 2 | 0 | 0 | 0 | 1 | 0 | 1  A | 1 |
| 1 | 0 | 0 | 0 | 0 | 1 | 1 | 1 |
| 0 | 0 | 0 | 0 | 0 | 0 | 1 ↓ | 1 |

FIG. 6

| | DP1 (DQ1) | DP2 (DQ2) | DP3 (DQ3) | DP4 (DQ4) | EP (EQ) | XDRP (XDRQ) | |
|---|---|---|---|---|---|---|---|
| 31 | 1 | 1 | 1 | 1 | 1 | 0 | |
| 30 | 1 | 1 | 1 | 1 | 0 | 0 | |
| 29 | 1 | 1 | 1 | 0 | 1 | 0 | |
| 28 | 1 | 1 | 1 | 0 | 0 | 0 | |
| 27 | 1 | 1 | 0 | 1 | 1 | 0 | E |
| 26 | 1 | 1 | 0 | 1 | 0 | 0 | |
| 25 | 1 | 1 | 0 | 0 | 1 | 0 | |
| 24 | 1 | 1 | 0 | 0 | 0 | 0 | |
| 23 | 1 | 0 | 1 | 1 | 1 | 1 | |
| 22 | 1 | 0 | 1 | 1 | 0 | 1 | |
| 21 | 1 | 0 | 1 | 0 | 1 | 1 | |
| 20 | 1 | 0 | 1 | 0 | 0 | 1 | |
| 19 | 1 | 0 | 0 | 1 | 1 | 1 | |
| 18 | 1 | 0 | 0 | 1 | 0 | 1 | |
| 17 | 1 | 0 | 0 | 0 | 1 | 1 | |
| 16 | 1 | 0 | 0 | 0 | 0 | 1 | |
| 15 | 0 | 1 | 1 | 1 | 1 | 1 | D |
| 14 | 0 | 1 | 1 | 1 | 0 | 1 | |
| 13 | 0 | 1 | 1 | 0 | 1 | 1 | |
| 12 | 0 | 1 | 1 | 0 | 0 | 1 | |
| 11 | 0 | 1 | 0 | 1 | 1 | 1 | |
| 10 | 0 | 1 | 0 | 1 | 0 | 1 | |
| 9 | 0 | 1 | 0 | 0 | 1 | 1 | |
| 8 | 0 | 1 | 0 | 0 | 0 | 1 | |
| 7 | 0 | 0 | 1 | 1 | 1 | 0 | |
| 6 | 0 | 0 | 1 | 1 | 0 | 0 | |
| 5 | 0 | 0 | 1 | 0 | 1 | 0 | |
| 4 | 0 | 0 | 1 | 0 | 0 | 0 | E |
| 3 | 0 | 0 | 0 | 1 | 1 | 0 | |
| 2 | 0 | 0 | 0 | 1 | 0 | 0 | |
| 1 | 0 | 0 | 0 | 0 | 1 | 0 | |
| 0 | 0 | 0 | 0 | 0 | 0 | 0 | |

GAIN CONTROL CIRCUITRY FOR QAM DEMODULATOR

BACKGROUND OF THE INVENTION

The present invention relates generally to QAM quadrature amplitude modulation) demodulators, and more specifically to a control circuit for gain-controlled amplifiers which respectively amplify the in-phase and quadrature-phase components of a QAM signal.

According to a prior art QAM demodulator as shown in FIG. 1, in-phase P-channel baseband signal and a quadrature phase Q-channel baseband signal are applied respectively to gain-controlled amplifiers 1P and 1Q converted to digital signals by A/D converters 2P and 2Q. The digital signals from A/D converters 2P and 3P are applied to threshold decision circuits 3P and 3Q, respectively, in each of which a decision is made on whether the respective signal is higher or lower than a signal point of the signal constellation of the QAM signal to produce data bits and an error bit. Both data and error bits of the P- and Q-channel signals are applied to controllers 4P and 4Q, respectively, to derive gain control signals for coupling to the respective gain-controlled amplifiers. If the incoming signal is a 128-QAM signal, each threshold decision circuit produces a set of four data bits and one error bit in response to each signal point. The output of each threshold decision circuit is applied to the associated controller in which the signal constellation of the incoming signal is divided into regions A, B and C as shown in FIG. 2. The controller makes a decision in favor of a logical 1 if a given signal point belongs to outermost regions A or in favor of a logical 0 if it belongs to innermost region B. If the signal point lies within intermediate regions C, the decision is made in favor of the binary state of the previous time slot. The gain of each amplifier is reduced when the average number of logical 1's increases and increased when the average number of logical 0's decreases, and by doing this the gain is converged to the reference signal points. The other function of each gain controlled amplifier is to compress the dynamic range of the respective baseband signal so that it does not exceed beyond the specified dynamic range of the input to the associated A/D converter even if the waveform of the signal is severely distorted during propagation. The dynamic range of the digital output from each A/D converter needs to be expanded to the original range before being compared with the thresholds of each decision circuit 3.

However, the number of the innermost signal points lying on the lines that define boundaries between regions B and C is greater than the number of the outermost signal points lying on the lines defining boundaries between regions A and C. Since the probability of occurrences of a logical 1 is equal to that of a logical 0 in the signal constellation of a 128-QAM signal, the ratio of the likelihood of each gain control signal assuming a logical 1 to the likelihood of it assuming a logical 0 is 8:12 when the received signal points are converged to the reference signal points. Although the likelihood of occurrences is in imbalance between 1's and 0's, an input level fluctuation will cause logical 1's and 0's to occur at different rates as long as the feedback operation is in the process of convergence to the reference signal points so that the gain is quickly adjusted to counteract the fluctuation. If the feedback operation is in a process from a diverged to a converged state, on the other hand, the gain of each AGC amplifier is raised to a level higher than the range of values normally used during the converged state so that the occurrences of logical 1's and 0's are made to be equal to each other. However, under such circumstances the imbalance between 1's and 0's causes the feedback loop to enter a state of instability, and difficulty results for restoring the state of convergence.

SUMMARY OF THE INVENTION

It is therefore an object of the present invention to provide high stability gain control circuitry for QAM signals.

According to the present invention, there is provided a gain control circuit for first and second gain-controlled amplifiers of a $2^{2n+3}$-QAM demodulator in which the first- and second-channel baseband components of the QAM signal are respectively amplified and a first data signal and a first error signal are recovered from the output of the first gain-controlled amplifier and a second data signal and a second error signal are recovered from the output of the second gain-controlled amplifier. In order to determine the location of the signal point of the first baseband component, the signal constellation of the QAM signal is divided along the axis of the first baseband component into two outermost regions $A_1$, an innermost region $B_1$, and two intermediate regions $C_1$ respectively lying between the outermost regions $A_1$ and the innermost region $B_1$ and further divided along the first axis into two outer regions $E_2$ and an inner region $D_2$ between the outer regions $E_2$. The location of the signal point of the first baseband component is determined with respect to the regions $A_1$, $B_1$, $C_1$, $D_z$ and $E_2$ in dependence on the first data signal and the first error signal to produce a first logical output signal representing the location determined with respect to the regions $A_1$, $B_1$ and $C_1$, and a second logical output signal representing the location determined with respect to the regions $D_2$ and $E_2$. To determine the location of the signal point of the second baseband component, the signal constellation is likewise divided along the axis of the second baseband component into two outermost regions $A_2$, an innermost region $B_2$, and two intermediate regions $C_2$ respectively lying between the outermost regions $A_2$ and the innermost region $B_2$ and further divided along the same axis into two outer regions $E_1$ and an inner region $D_1$ between the outer regions $E_1$. The location of the signal point of the second baseband component is determined with respect to the regions $A_2$, $B_2$, $C_2$, $D_1$ and $E_1$ in dependence on the second data signal and the second error signal to produce a third logical output signal representing the location determined with respect to the regions $A_2$, $B_2$ and $C_2$, and a fourth logical output signal representing the location determined with respect to the regions $D_1$ and $E_1$. The first gain-controlled amplifier is controlled in accordance with the first and fourth logical output signals and the second gain-controlled amplifier is controlled in accordance with the third and second logical output signals.

BRIEF DESCRIPTION OF THE DRAWINGS

The present invention will be described in further detail with reference to the accompanying drawings, in which:

FIG. 4 is a circuit diagram illustrating details of the controller of FIG. 3;

FIG. 5 is a view showing details of the read-only memories of FIG. 4 in which the signal constellation of an incoming QAM signal is divided along the respective axes of the signal;

FIG. 6 is a view showing details of the read-only memories of FIG. 4 in which the signal constellation of an incoming QAM signal are divided along the axes orthogonal to the axes of FIG. 5.

DETAILED DESCRIPTION

Figure 1:
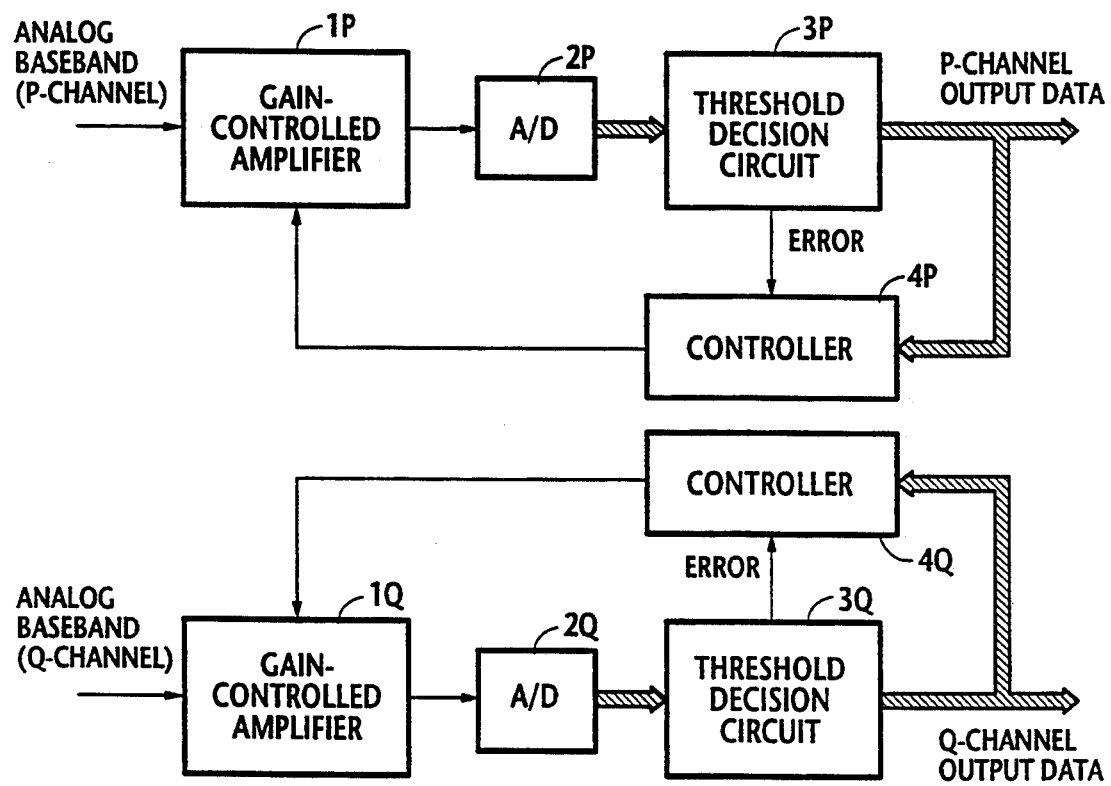
FIG. 1 is a block diagram of a prior art automatic gain control circuitry of QAM signals.
Figure 2:
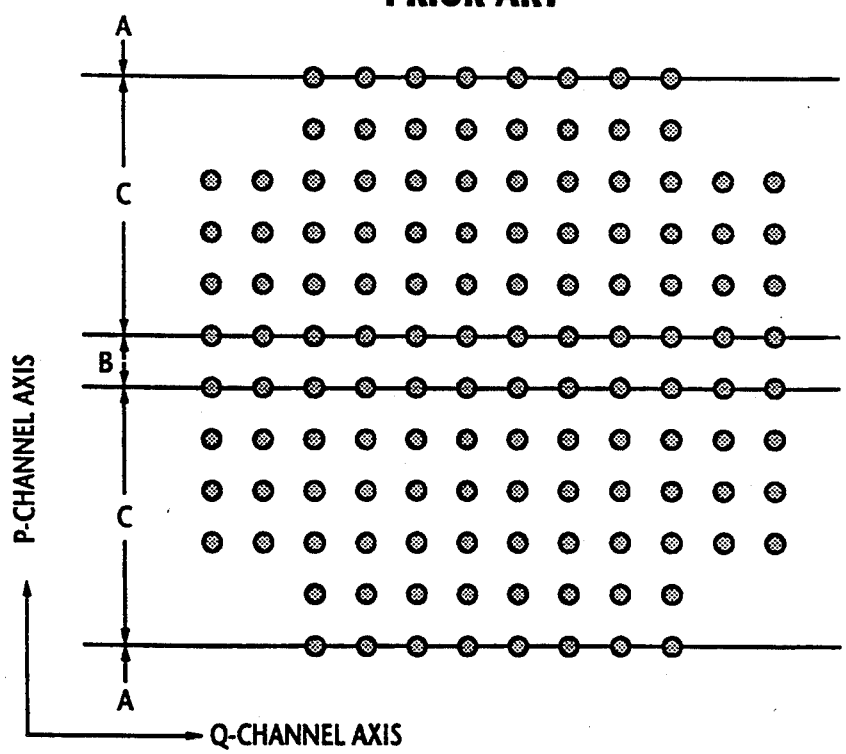
FIG. 2 is a signal constellation of the prior art gain control circuitry for the P channel of a 128-QAM signal.
Figure 3:
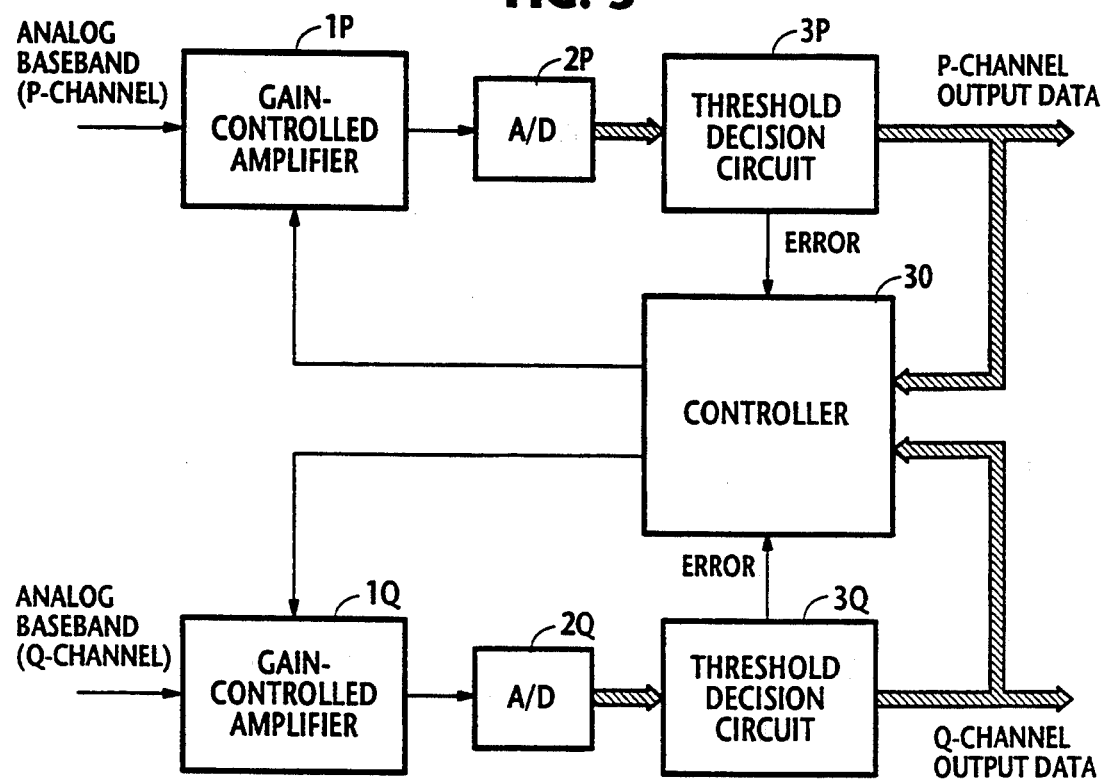
FIG. 3 is a block diagram of the automatic gain control circuitry of the present invention.

Referring now to FIG. 3, there is shown a $2^{2n+3}$-QAM (quadrature amplitude modulation) demodulator according to the present invention. The present invention is characterized by the provision of a controller 30 instead of the prior art controllers 4P and 4Q. As shown in detail in FIG. 5, the controller 30 comprises a pair of identical control circuits one for each channel. Each control circuit comprises read-only memories 40 and 41, an AND gate 42 and a type-D flip-flop 43.

As shown in FIG. 5, read-only memory 40P determines the relative positions of P-channel signal points along the P-channel axis of the signal constellation by storing an output data bit (DRP) and an output error bit (ERP) in a location addressable as a function of a corresponding set of four data bits DP1, DP2, DP3 and DP4 and an error bit EP from the P-channel decision circuit 3P, while read-only memory 40Q determines the relative positions of Q-channel signal points along the Q-channel axis of the signal constellation by storing an output data bit (DRQ) and an output error bit (ERQ) in a location addressable as a function of each set of four data bits DQ1, DQ2, DQ3 and DQ4 and an error bit EQ from threshold decision circuit 3Q.

Figure 7:
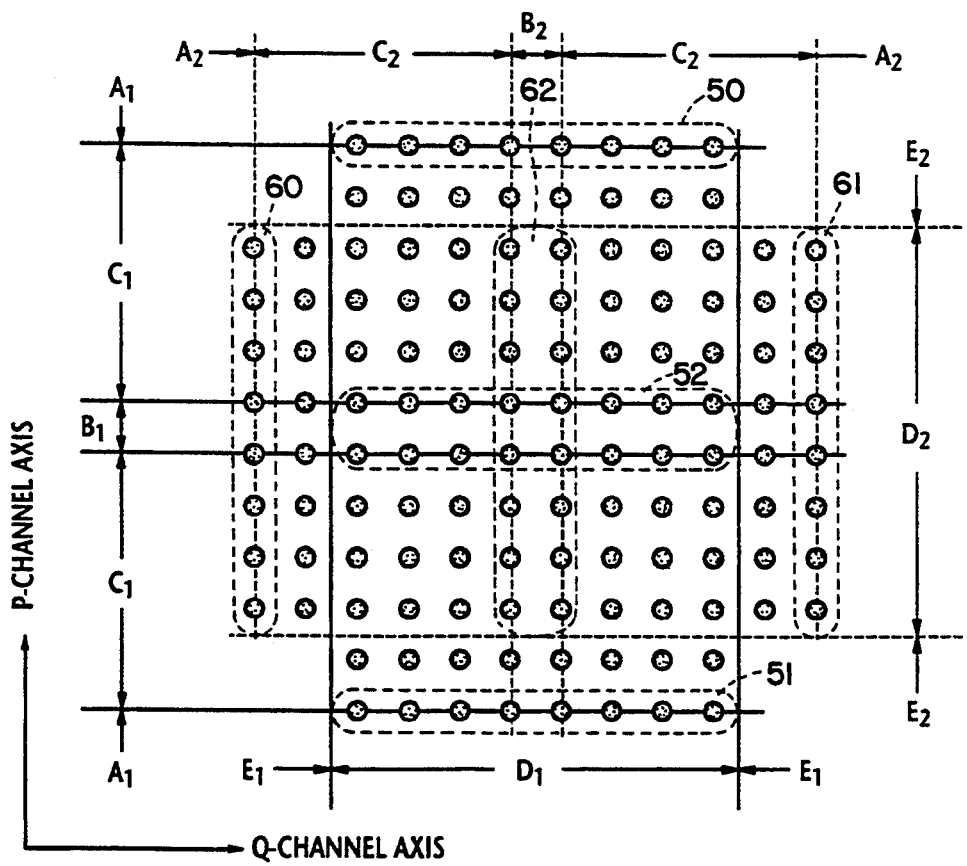
FIG. 7 is a signal constellation of the present invention for a 128-QAM signal.

It is seen that the signal constellation is divided along each of its orthogonal axes into 32 threshold decision levels which are further subdivided into five upper levels and five lower levels for defining outermost regions A, and two innermost levels (levels #15 and #16) for defining an innermost region B, and intermediate levels #5 to #14 and #17 to #26 for defining intermediate regions C. As output data bits (DRP and DRQ), logical 1's are stored in regions A and B and logical 0's are stored in regions C, and as output error bits (ERP and ERQ) logical 1's are stored in regions A and logical 0's are stored in regions B and C. In this way, the signal constellation is divided along the P-channel axis into outermost regions $A_1$, innermost region $B_1$ and intermediate regions $C_1$ as shown in FIG. 7, and further divided along its Q-channel axis into regions $A_2$, $B_2$ and $C_2$.

As shown in FIG. 6, the 32 threshold decision levels of the signal constellation are subdivided along each axis into 16 inner levels (levels #8 to #23) for defining an inner region D and eight upper levels and eight lower levels for defining outer regions E.

Read-only memory 41P determines whether the P-channel signal belongs to region $D_1$ or regions $E_1$ by defining a map in which logical 1's or 0's are stored in locations addressable as a function of the same five input bits as those applied to ROM 40P. Likewise, read-only memory 41Q determines whether the Q-channel signal belongs to region $D_2$ or regions $E_2$ by defining a map in which logical 1's or 0's are stored in locations addressable as a function of the same five input bits as those applied to ROM 40Q. Read only memory 41P produces a logical 1 as an output data bit XDRP if the signal point lies within the inner region $D_1$ along the P-channel axis and a logical 0 if it lies in the outer regions $E_1$. Read-only memory 41Q produces a logical-1 output (XDRQ) if the signal point lies within the inner region $D_2$ of the Q-channel axis and a logical-0 output if it lies in outer regions $E_2$.

The error output bit ERP of ROM 40P is applied to the data input of flip-flop 43P and its data output bit DRP is applied as an enabling pulse to one input of AND gate 42P, while the data output bit XDRP of ROM 41P is cross-coupled to AND gate 42Q as an enabling pulse. In like manner, the error output bit ERQ of ROM 40Q is applied to the data input of flip-flop 43Q and its data output bit DRQ is applied to AND gate 42Q, while the output data bit XDRQ of ROM 41Q is cross-coupled to AND gate 42P as an enabling pulse. Clock pulses are supplied from a clock source 44 to the clock inputs of flip-flops 43P and 43Q through AND gates 42P and 42Q, respectively.

Therefore, if the P-channel signal point belongs to regions $A_1$ and the Q-channel signal point simultaneously belongs to regions $D_2$, or if the P-channel signal point belongs to regions $B_1$ and the Q-channel signal point simultaneously belongs to regions $D_2$, AND gate 42P is enabled to drive flip-flop 43P, and if the Q-channel signal point belongs to regions $A_2$ and the Q-channel signal point simultaneously belongs to regions $D_1$ or if the P-channel signal point belongs to regions $B_2$ and the Q-channel signal point simultaneously belongs to regions $D_1$, AND gate 42Q is enabled to drive flip-flop 43Q. Flip-flop 43P produces a logical 1 if the signal point belongs to regions $A_1$ and $D_2$ and a logical 0 if it belongs to regions $B_1$ and $D_2$. Otherwise, each flip-flop retains the logical state of the previous time slot.

It is seen from FIG. 7, the total number of reference signal points which lie on the boundary between regions $A_1$ and $C_1$ and within the region D1 is equal to the total number of reference signal points which lie on the boundary between regions $B_1$ and $C_1$ and within the region D1. Likewise, the total number of reference signal points which lie on the boundary between regions $A_2$ and $C_2$ and within the region D2 is equal to the total number of reference signal points lying on the boundary between regions $B_2$ and $C_2$ and within the region D2. As result, the flip-flops 43P and 43Q will assume each binary state at equal probability of occurrences when the feedback system is converging to the reference signal points.

Gain-controlled amplifiers 1P and 1Q are responsive to the outputs of flip-flops 43P and 43Q, respectively, to adjust their gains in a direction opposite to the direction in which the respective analog baseband signal is varying. Since the occurrences of logical 1's and 0's are balanced with each other, amplifiers 1P and 1Q ensure stability during a transition from a diverged state to a converged state.

What is claimed is:

1. A gain control circuit for first and second gain-controlled amplifiers which amplify first- and second-channel baseband components of a $2^{2n+3}$-QAM (quadrature amplitude modulation) signal, respectively, said baseband components having an orthogonal phase relationship with respect to each other, said circuit comprising:

means for recovering a first data signal and a first error signal from the output of said first gain-controlled amplifier and recovering a second data signal and a second error signal from the output of said second gain-controlled amplifier;

means for defining along a first axis of the signal constellation of the QAM signal two outermost regions $A_1$, an innermost region $B_1$, and two intermediate regions $C_1$ respectively lying between the outermost regions $A_1$ and the innermost region $B_1$ and defining along said first axis of said constellation two outer regions $E_2$ and an inner region $D_2$ therebetween, and determining the location of the signal point of said first baseband component with respect to said regions $A_1$, $B_1$, $C_1$, $D_2$ and $E_2$ in dependence on said first data signal and said first error signal to produce a first logical output signal representative of the location determined with respect to the regions $A_1$, $B_1$ and $C_1$, and a second logical output signal representative of the location determined with respect to the regions $D_2$ and $E_2$;

means for defining along a second, orthogonal axis of the signal constellation two outermost regions $A_2$, an innermost regions $B_2$, and two intermediate regions $C_2$ respectively lying between the outermost regions $A_2$ and the innermost region $B_2$ and defining along said second axis of said constellation two outer regions $E_1$ and an inner region $D_1$ therebetween, and determining the location of the signal point of said second baseband component with respect to said regions $A_2$, $B_2$, $C_2$, $D_1$ and $E_1$ in dependence on said second data signal and said second error signal to produce a third logical output signal which is representative of the location determined with respect to the regions $A_2$, $B_2$ and $C_2$, and a fourth logical output signal representative of the location determined with respect to the regions $D_1$ and $E_1$; and means for controlling said first gain-controlled amplifier in accordance with said first and fourth logical output signals and controlling said second gain-controlled amplifier in accordance with said third and second logical output signals.

2. In a $2^{2n+3}$-QAM (guadrature amplitude modulation) demodulator including first and second gain-controlled amplifiers for amplifying first and second, mutually orthogonal baseband components of the QAM signal, respectively, first and second (A/D) analog-to-digital converters for converting output signals from the first and second gain-controlled amplifiers to corresponding digital signals, a first threshold decision circuit for comparing the digital signal from the first A/D converter with decision thresholds to produce first-channel data bits and a first-channel error bit, and a second threshold decision circuit for comparing the digital signal for the second A/D converter with decision thresholds to produce second-channel data bits and a second-channel error bit, a gain control circuit comprising:

first decision means for defining along a first axis of the signal constellation of the QAM signal two outermost regions $A_1$, an innermost region $B_1$, and two intermediate regions $C_1$ respectively lying between the outermost regions $A_1$ and the innermost region $B_1$ and defining along said first axis of said constellation two outer regions $E_2$ and an inner region $D_2$ therebetween, and determining the location of the signal point of said first baseband component with respect to said regions $A_1$, $B_1$, $C_1$, $D_2$ and $E_2$ in dependence on said first-channel data bits and said first-channel error bit to derive a first logical output signal (ERP, DRP) from the determination made with respect to the regions $A_1$, $B_1$ and $C_1$, and a second logical output signal (XDRP) from the determination made with respect to the regions $D_2$ and $E_2$;

second decision means for defining along a second orthogonal axis of the signal constellation two outermost regions $A_2$, an innermost region $B_2$ and two intermediate regions $C_2$ respectively lying between the outermost regions $A_2$ and the innermost region $B_2$ and defining along said second axis of said constellation two outer regions $E_1$ and an inner region $D_2$ therebetween, and determining the location of the signal point of said second baseband component with respect to said regions $A_2$, $B_2$, $C_2$, $D_1$ and $E_1$ in dependence on said second-channel data bits and said second-channel error bit to derive a third logical output signal (ERQ, DRQ) from the determination made with respect to the regions $A_2$, $B_2$ and $C_2$, and a fourth logical output signal (XDRQ) from the determination made with respect to the regions $D_2$ and $E_1$; and control means for controlling said first gain-controlled amplifier in accordance with said first and fourth logical output signals and controlling said second gain-controlled amplifier in accordance with said third and second logical output signals.

3. A gain control circuit as claimed in claim 2, wherein said first logical output signal comprises a first binary signal (ERP) representing the location of the signal point of the first baseband component with respect to boundaries between said regions $A_1$ and $C_1$ and a second binary signal (DRP) representing the location of said signal point with respect to boundaries between said regions $A_1$, $C_1$ and $B_1$, and said third logical output signal (ERQ, DRQ) comprises a third binary signal (ERQ) representing the location of the signal point of the second baseband component with respect to boundaries between said regions $A_2$ and $C_2$ and a fourth binary signal (DRQ) representing the location of said signal point with respect to boundaries between said regions $A_2$, $C_2$ and $B_2$, wherein said control means comprises:

a first flip-flop having a data input terminal for receiving said first binary signal (ERP) and a clock input terminal, said first flip-flop producing a control signal for said first gain-controlled amplifier;

a second flip-flop having a data input terminal for receiving said third binary signal (ERQ) and a clock input terminal, said second flip-flop producing a control signal for said second gain-controlled amplifier;

first coincidence gate means for driving the clock input terminal of said first flip-flop in response to said second binary signal (DRP) and the fourth logical output signal (XDRQ); and second coincidence gate means for driving the clock input terminal of said second flip-flop in response to said fourth binary signal (DRQ) and said second logical output signal (XDRP).

4. In a $2^{2n+3}$-QAM (quadrature amplitude modulation) demodulator including first and second gain-controlled amplifier for amplifying in-phase and quadrature-phase baseband components of the QAM signal, respectively, first and second (A/D) analog-to-digital converters for converting output signals from the first and second gain-controlled amplifiers to corresponding digital signals; a first threshold decision circuit for comparing the digital signal from the first A/D converter with decision thresholds to produce first-channel data bits and a first-channel error bit; and a second threshold decision circuit for comparing the digital signal from the second A/D converter with decision thresholds to produce second-channel data bits and a second-channel error bit, a method for controlling said first and second gain controlled amplifiers, the method comprising the steps of:

a) defining along a first axis of the signal constellation of the QAM signal two outermost regions $A_1$, an innermost region $B_1$, and two intermediate regions $C_1$ respectively lying between the outermost regions $A_1$ and the innermost region $B_1$ and defining along said first axis of said constellation two outer regions $E_2$ and an inner region $D_2$ therebetween;

b) defining along a second, orthogonal axis of the signal constellation two outermost regions $A_2$, an innermost region $B_2$, and two intermediate regions $C_2$ respectively lying between the outermost regions $A_2$ and the innermost region $B_2$ and defining along said second axis of said constellation two outer regions $E_1$ and an inner region $D_1$ therebetween;

c) determining the location of the signal point of said in-phase baseband component with respect to said regions $A_1$, $B_1$, $C_1$, $D_2$ and $E_2$ in dependence on said first-channel data bits and said first-channel error bit to make a first decision with respect to the regions $A_1$, $B_1$ and $C_1$, and a second decision with respect to the regions $D_2$ and $E_2$;

d) determining the location of the signal point of said quadraturephase baseband component with respect to said regions $A_2$, $B_2$, $C_2$, $D_1$ and $E_1$ in dependence on said second-channel data bits and said second-channel error bit to make a first decision with respect to the regions $A_2$, $B_2$ and $C_2$, and a second decision with respect to the regions $D_1$ and $E_1$; and e) controlling said first gain-controlled amplifier in accordance with said first decision of the step (c) and the second decision of the step (d) and controlling said second gain-controlled amplifier in accordance with said first decision of the step (d) and the second decision of the step (c).

* * * * *